United States Patent [19] [11] 3,988,672
Cowart [45] Oct. 26, 1976

[54] PARAMETRIC TESTER FOR SEMICONDUCTOR DEVICES
[75] Inventor: Brooks E. Cowart, Mountain View, Calif.
[73] Assignee: Fairchild Camera and Instrument Corporation, Mountain View, Calif.
[22] Filed: Mar. 13, 1975
[21] Appl. No.: 558,185

[52] U.S. Cl. .......................... 324/158 R; 324/73 R; 324/158 D; 324/158 T
[51] Int. Cl.[2] .......................................... G01R 31/22
[58] Field of Search ........ 324/158 R, 158 D, 158 T, 324/133, 73 R

[56] References Cited
UNITED STATES PATENTS
3,622,883  11/1971  Haire .............................. 324/158 T Primary Examiner—Robert Segal
Assistant Examiner—Ernest F. Karlsen
Attorney, Agent, or Firm—Alan H. MacPherson; Henry K. Woodward; J. Ronald Richbourg

[57] ABSTRACT

A tester for conducting parametric tests on semiconductor devices comprises a current source means to be electrically coupled to a particular lead of the device under test to supply the maximum current specified to be drawn by said lead at a fixed voltage, a voltage maintenance means electrically coupled to the lead to maintain the lead at the specified voltage and a current direction-sensing means electrically coupled between the lead and the voltage maintenance means to detect the direction of current flow to determine whether the lead draws more or less current than the constant current.

6 Claims, 3 Drawing Figures

PARAMETRIC TESTER FOR SEMICONDUCTOR DEVICES

This invention relates to a current-limit scheme for testing semiconductor devices and, more particularly, relates to a tester for conducting parametric tests on a packaged semiconductor device through its external input leads.

Two types of tests, functional and parametric, are commonly performed on packaged semiconductor logic devices to verify their acceptability for a particular use. Such devices are supposed to be capable of performing complicated logic functions and are usually digital devices. Thus, functional testing is performed to determine whether a device meets a specified truth table, i.e., to determine whether it properly performs the designated logic functions. For example, an AND gate must satisfy a truth table in which the output is a digital "0" unless all inputs are a digital "1"; the output will be a digital "1" if and only if all inputs comprise a digital "1". These tests are accomplished simply by cycling through the input permutations and comparing the output to the output of a known good device or a representation of the appropriate truth table. Parametric testing involves the establishment of certain electrical conditions at the external leads of a digital semiconductor device and measuring certain circuit parameters. For example, the output leads are typically tested by applying a known current to the output pins or leads (while the input pins are set at appropriate fixed voltages to establish a logic condition which produces an output at the lead under test) and then measuring the voltage on the output lead. The measured voltage is compared to a specified voltage with the device being good if the measured voltage is less than or equal to the specified voltage. Parametric tests of input leads are typically conducted by applying a constant voltage to the input leads and determining the amount of current which is drawn by the lead. The particular lead passes the parametric test if the lead draws no more current than specified; the output leads need not be connected.

Existing systems for carrying out tests on the external leads of digital semiconductor devices typically include hard-wired, breadboarded versions of the circuit incorporated in the device under test. The performance of the breadboarded version is then compared with the performance of the device under test. For functional testing the logic output of the breadboarded version is compared to the output of the semiconductor device to ensure that the appropriate truth table is generated. For parametric testing the voltage and current levels are compared. Such systems are bulky and limited to less complex circuits. Alternatives to hard-wired systems have been developed. These typically utilize software to simulate the expected responses for a known good device under the range of operating conditions for which the device is designed. Such software is usually sophisticated and costly.

A low-cost, bench-top tester has been developed which utilizes a digitally programmed software card, designated Qual-Card (a trademark of the assignee of this application) which contains information to permit both functional and parametric testing. A key requirement for the tester, designated Qualifier (also a trademark of the assignee of this application) was the implementation of tests with simple circuitry. Since a constant current source was included in the tester to conduct parametric tests of output leads, as described above, it was desirable to utilize the constant current source, if possible, in carrying out parametric tests of input leads.

SUMMARY OF THE INVENTION

The present invention comprises a tester for conducting parametric tests on a digital semiconductor device through its external leads. Tests are conducted by applying a known voltage to a particular input lead and determining whether more current is drawn by the lead than is allowable for an acceptable device. The device comprises a current source means electrically coupled to a particular lead of the device under test for supplying a constant current to the lead, a voltage maintenance means electrically coupled to the lead for maintaining the lead at a specified voltage, and current direction-sensing means electrically coupled between the voltage maintenance means and the lead to detect the direction of current flow between the voltage maintenance means and the lead, thereby determining whether the lead draws more or less current than the constant current. If the constant current is set at a maximum current which should be drawn by the device at the set voltage, then a net current flow from the voltage maintenance means to the particular lead will occur for an unacceptable device, whereas a net current flow toward the voltage maintenance means will signify that the lead under test is drawing less current than the maximum specified current and, therefore, the particular lead passes the parametric test. In a preferred embodiment, the direction-sensing means of the present invention comprises a non-linear bidirectional load electrically coupled between the lead under test and the voltage maintenance means; a voltage comparator whose inputs are electrically coupled to respective ones of the terminals of the bidirectional load, and an error detector electrically coupled to the output of the voltage comparator to determine whether the output of the voltage comparator signifies a net flow into the lead or towards the voltage maintenance means.

BRIEF DESCRIPTION OF THE DRAWINGS

For a more complete understanding of the tester of the present invention for conducting parametric tests, reference may be had to the accompanying drawings which are incorporated herein and in which.

DESCRIPTION OF THE PREFERRED EMBODIMENT

Figure 1:
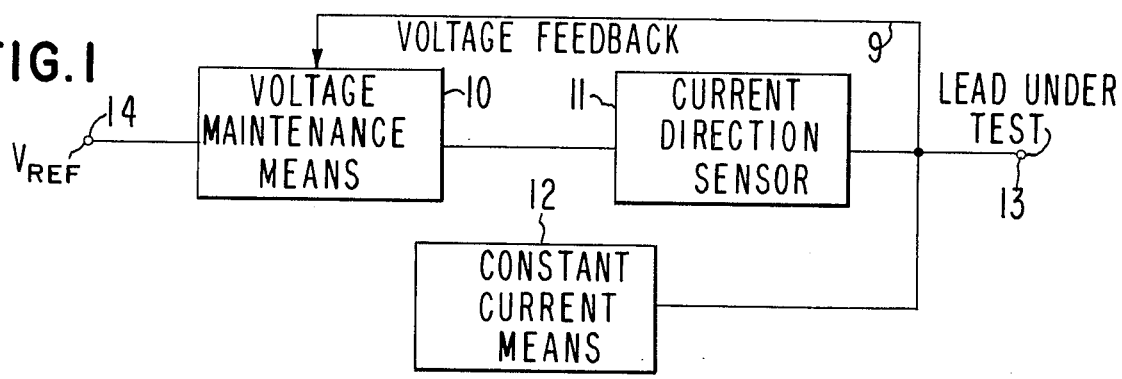
FIG. 1 is a block diagram of the overall tester of the present invention.

Parametric tests of the individual input leads of a DIC device under test are accomplished as shown by the block diagram of FIG. 1. A reference voltage $V_{REF}$ at which a particular lead of the device under test is to be maintained is applied at terminal 14. $V_{REF}$ is a fixed voltage which is determined by the operating parameters of the particular lead of the device under test. Since transient conditions will be encountered as test conditions are being established, it is necessary that a voltage maintenance means 10 be provided to maintain the voltage at terminal 13 constant at the value $V_{REF}$. The voltage feedback loop 9 provides voltage means 10 with a continuous feedback which permits it to continuously monitor and correct the voltage appearing at terminal 13. A constant current is supplied to terminal 13 by constant current means 12. The value of the current supplied by constant current means 12 is typically selected to be equal to the maximum current which the particular lead of the device under test would draw if it is functioning within parametric limits. If the device under test draws precisely the current specified, then there will be no net current flowing in current direction sensor 11. If, however, as will occur virtually all the time, there is a deviance between the specified current and the actual current drawn, a net current will flow in current direction sensor 11. This current may be positive or negative. If there is a net current flow into the device under test, then the device will be drawing too much current and will not be a good device. If, on the other hand, less current than that supplied by constant current means 12 is drawn by the lead under test, the net current will flow into the current direction sensor 11. In this event, it will be known that the device is operating within parametric limits and is good. The excess current provided to the device under test, if excess current is drawn, will be supplied by voltage maintenance means 10 which provides the current in order to bring the voltage at terminal 13 up to the level of $V_{REF}$.

Figure 2:
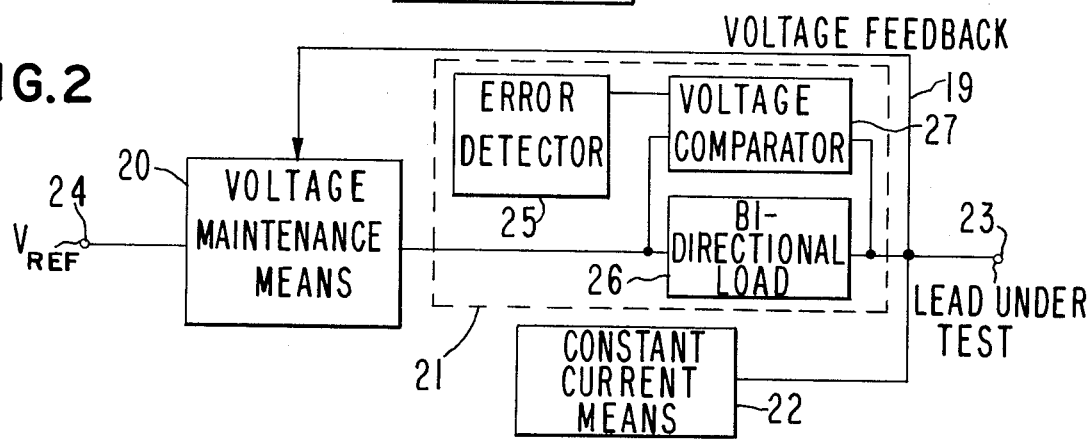
FIG. 2 is a block diagram of a particular embodiment of the tester of FIG. 1.

A particular embodiment of the tester of FIG. 1 is shown in the block diagram of FIG. 2. As in FIG. 1, a voltage $V_{REF}$ is applied at terminal 24 to establish the specified voltage for the lead under test. Voltage feedback loop 19 permits the voltage maintenance means to ensure that the voltage at terminal 23 is continuously maintained at $V_{REF}$. Constant current means 22 provides either a positive or negative current to the pin of a device under test which is the maximum allowable for a functioning device. The current direction sensor incorporated within dashed line 21 includes a bidirectional load 26, voltage comparator 27 and error detector 25. Bidirectional load 26 is preferably non-linear to obtain improved dynamic characteristics. Bidirectional load 26 will permit current to flow from voltage maintenance means 20 to terminal 23 and thus to the device under test; bidirectional load 26 will also permit current to flow from constant current means 22 to an appropriate sink within the voltage maintenance means. The external terminals of bidirectional load 26 will repose at slightly different voltages, depending upon the direction of current flow. Thus, voltage comparator 27, connected to the external leads, senses the voltage levels and produces a logical output determined by the direction of current flow. This logical output, when fed into error detector 25, is compared with a logic pulse generated in accordance with recorded data which contains information on the direction current will flow in the bidirectional load if less than the specified current is drawn by the lead under test. Error detector 25 will indicate whether the logical output signifies a good or bad device.

Figure 3:
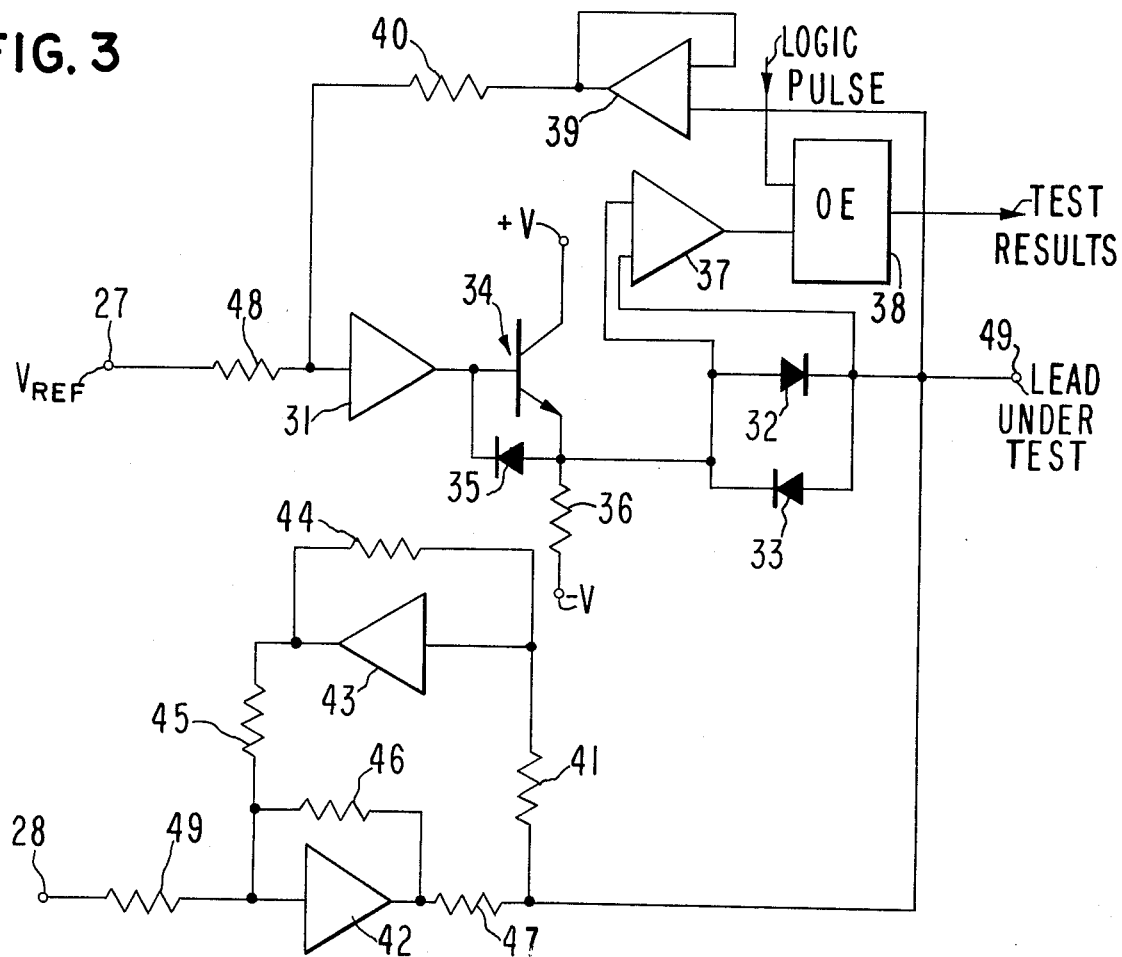
FIG. 3 is a schematic diagram of an embodiment of the tester of FIG. 2.

FIG. 3 illustrates a circuit schematic embodiment of the tester of FIG. 2. In the embodiment illustrated, the reference voltage $R_{VEF}$ is supplied at terminal 27 and is the negative analog of the voltage at which the voltage of the lead under test is to be maintained. $V_{REF}$ is connected through buffer resister 48 to the virtual ground or input of inverting amplifier 31. The output of inverting amplifier 31 is connected to the cathode of diode 35 and to the base of transistor 34. The anode of diode 35 is connected to the emitter of transistor 34. Inverting amplifier 31 serves as a current source to maintain terminal 49 at the specified voltage under transitory conditions and if the device under test draws more current than the specified maximum. Since a typical integrated circuit inverting amplifier inherently is not able to supply more than about 5 to 10 milliamps, transistor 34 is used in an emitter-follower configuration to produce current as necessary. In the positive-going direction of the system, that is, when a positive current is required to maintain the specified voltage, a current is supplied from the positive reference tied to the collector of transistor 34 through transistor 34 and ultimately to the lead under test. In like manner, in the negative-going direction of the system, that is, when the device under test cannot accept all positive current available from the constant current means, current may be absorbed through resistor 36 or by inverting amplifier 31 through diode 35. The reverse parallel diodes 32 and 33 constitute a non-linear bidirectional load which, in combination, permit current to pass in either direction. This non-linear bidirectional load is preferred in order to improve dynamic range. The voltage levels of the two sides of the reverse-coupled diodes 32 and 33 are fed into the input of comparator 37. The logic level output of comparator 37 will contain information on the results of the parametric test. In order to interpret these results, it is necessary to use the exclusive OR gate 38 whose other input comes from a logic pulse generated by test criteria stored within the system. This logic test criteria will reflect the specified response of the device under test when a particular constant current is applied. The output of exclusive OR gate 38 will indicate whether the particular pin of the device under test fails or passes the parametric test.

To produce a constant current for use on the device under test, a group of unity-gain amplifiers is employed. Resistor 49 is connected to terminal 28 and to the virtual ground or input of inverting amplifier 42. The output of inverting amplifier 42 is connected through resistor 46 back to its virtual ground. Normally, then, since this combination comprises a unity-gain amplifier, the voltage at the output of inverting amplifier 42 will seek to remain at the voltage level of terminal 28. The additional combination of resistor 41, resistor 44 and inverting amplifier 43 establishes a near unity-gain amplifier, the gain being corrected to compensate for the current drawn by resistor 41. This correction is established by making the value of resistor 44 equal to the sum of the values of resistors 41 and 47. The connections of these two unity-gain amplifier units as shown results in the maintenance of a constant voltage difference across resistor 47, corrected for the current drawn by resistor 41. Therefore, the current emerging from the junction of resistor 41 and resistor 47 is a constant current determined by the reference voltage present at terminal 28.

What is claimed is:

1. A tester for conducting parametric tests on a semiconductor device having a plurality of electrical leads, said tester comprising:
   a. a constant current source means having an output terminal electrically coupled to a particular lead of the semiconductor device under test, and being disposed for supplying a constant current to the lead;
   b. voltage maintenance means having a first input terminal coupled to a reference voltage source, a second feedback input terminal coupled to the particular lead of the device under test, and an output terminal electrically coupled to the particular lead of the device under test for maintaining the lead at a specified voltage; and, c. a current direction-sensing means electrically coupled between said voltage maintenance means and the particular lead of the device under test to detect the direction of current flow between said voltage maintenance means and the particular lead to thereby determine whether the lead draws more or less current than current supplied by said constant current source; said current direction-sensing means comprising:
  i. a bidirectional load electrically coupled between the particular lead and said voltage maintenance means;
  ii. a voltage comparator whose inputs are electrically coupled to respective ones of the terminals of said bidirectional load; and
  iii. an error detector electrically coupled to the output of said voltage comparator to determine whether said output of said voltage comparator signifies that said lead draws more or less current than said constant current.

2. The tester as recited in claim 1 wherein said bidirectional load is non-linear.

3. The system as recited in claim 2 wherein said non-linear bidirectional load comprises a pair of diodes connected in reverse parallel order.

4. The tester as recited in claim 1 wherein said error detector is an exclusive OR gate whose inputs are electrically coupled respectively to the output of said voltage comparator and to a logic pulse whose sense is determined in accordance with the relative values of said constant current and the current specified for said lead.

5. The tester as recited in claim 4 wherein said constant current is equal to the maximum current specified for said lead.

6. The tester as recited in claim 5 wherein said voltage maintenance means comprises:
  a first resistor, one terminal of which is coupled to a reference voltage;
  an inverting amplifier whose input is electrically coupled to the other terminal of said first resistor and to said lead under test;
  a transistor whose base is connected to the output of said inverting amplifier, whose collector is connected to a first voltage reference and whose emitter is connected through a second resistor to a second voltage reference of opposite polarity to said first voltage reference, said emitter also being connected to one side of said bidirectional load; and
  a diode whose cathode is connected to the base of said transistor and whose anode is connected to the emitter of said transistor.

* * * * *